US011062826B2

(12) United States Patent
Arnold et al.

(10) Patent No.: US 11,062,826 B2
(45) Date of Patent: Jul. 13, 2021

(54) NANOCOMPOSITE MAGNETIC MATERIALS FOR MAGNETIC DEVICES AND SYSTEMS

(71) Applicant: University of Florida Research Foundation, Incorporated, Gainesville, FL (US)

(72) Inventors: David P. Arnold, Gainesville, FL (US); Jennifer S. Andrew, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 220 days.

(21) Appl. No.: 15/664,647

(22) Filed: Jul. 31, 2017

(65) Prior Publication Data

US 2017/0330657 A1 Nov. 16, 2017

Related U.S. Application Data

(62) Division of application No. 14/904,887, filed as application No. PCT/US2014/048112 on Jul. 25, 2014, now Pat. No. 9,818,514.
(Continued)

(51) Int. Cl.
*C22C 33/02* (2006.01)
*C23C 18/16* (2006.01)
(Continued)

(52) U.S. Cl.
CPC .............. *H01F 1/0576* (2013.01); *B22F 3/02* (2013.01); *B22F 3/26* (2013.01); *C22C 1/1036* (2013.01);
(Continued)

(58) Field of Classification Search
CPC .......... B22F 3/02; B22F 3/26; B22F 2998/10; C22C 1/1036; C22C 32/00; C22C 32/02;
(Continued)

(56) References Cited

U.S. PATENT DOCUMENTS 4,919,732 A 4/1990 Yang
5,612,131 A 3/1997 Bojarczuk, Jr.
(Continued)

FOREIGN PATENT DOCUMENTS

EP 1925686 6/2013
JP 2001-323343 11/2001
(Continued)

OTHER PUBLICATIONS

Hayashi et al (IEEE Transactions on Magnetics, vol. 48, No. 11, Nov. 2012). (Year: 2012).*
(Continued)

*Primary Examiner* — Louis J Rufo
(74) *Attorney, Agent, or Firm* — Thomas | Horstemeyer, LLP

(57) ABSTRACT

Nanocomposite magnetic materials, methods of manufacturing nanocomposite magnetic materials, and magnetic devices and systems using these nanocomposite magnetic materials are described. A nanocomposite magnetic material can be formed using an electro-infiltration process where nanomaterials (synthesized with tailored size, shape, magnetic properties, and surface chemistries) are infiltrated by electroplated magnetic metals after consolidating the nanomaterials into porous microstructures on planar substrates. The nanomaterials may be considered the inclusion phase, and the magnetic metals may be considered the matrix phase of the multi-phase nanocomposite.

21 Claims, 12 Drawing Sheets

Related U.S. Application Data

(60) Provisional application No. 61/858,987, filed on Jul. 26, 2013.

(51) Int. Cl.

| | | |
|---|---|---|
| *C23C 18/31* | (2006.01) | |
| *C23C 18/50* | (2006.01) | |
| *C25D 15/00* | (2006.01) | |
| *C25D 5/00* | (2006.01) | |
| *C25D 5/02* | (2006.01) | |
| *C25D 7/00* | (2006.01) | |
| *H01F 1/057* | (2006.01) | |
| *H01F 10/00* | (2006.01) | |
| *H01F 41/26* | (2006.01) | |
| *C22C 1/10* | (2006.01) | |
| *C22C 32/00* | (2006.01) | |
| *B22F 3/02* | (2006.01) | |
| *B22F 3/26* | (2006.01) | |
| *H01F 1/047* | (2006.01) | |
| *H01F 1/055* | (2006.01) | |
| *H01F 1/147* | (2006.01) | |
| *H01F 41/00* | (2006.01) | |
| *H01L 21/288* | (2006.01) | |
| *H01L 49/02* | (2006.01) | |
| *H01F 1/00* | (2006.01) | |

(52) U.S. Cl.
CPC .............. *C22C 32/00* (2013.01); *C22C 33/02* (2013.01); *C23C 18/1637* (2013.01); *C23C 18/1644* (2013.01); *C23C 18/1648* (2013.01); *C23C 18/31* (2013.01); *C23C 18/50* (2013.01); *C25D 5/00* (2013.01); *C25D 5/007* (2020.08); *C25D 5/022* (2013.01); *C25D 7/00* (2013.01); *C25D 7/001* (2013.01); *C25D 15/00* (2013.01); *H01F 1/047* (2013.01); *H01F 1/0556* (2013.01); *H01F 1/14733* (2013.01); *H01F 10/007* (2013.01); *H01F 41/005* (2013.01); *H01F 41/26* (2013.01); *H01L 21/2885* (2013.01); *H01L 28/10* (2013.01); *B22F 2998/10* (2013.01); *C22C 2202/02* (2013.01); *H01F 1/0054* (2013.01)

(58) Field of Classification Search
CPC ............. C22C 2202/02; C23C 18/1637; C23C 18/1644; C23C 18/1648; C23C 18/31; C23C 18/50; C25D 5/00; C25D 7/00; C25D 7/001; H01F 1/0054; H01F 1/047; H01F 1/0556; H01F 1/0576; H01F 1/14733; H01F 10/007; H01F 41/005; H01F 41/26; H01L 21/2885; H01L 28/10
See application file for complete search history.

(56) References Cited

U.S. PATENT DOCUMENTS

| | | | |
|---|---|---|---|
| 6,162,532 A | 12/2000 | Black | |
| 6,737,463 B2 | 5/2004 | Yadav | |
| 6,841,224 B2 | 1/2005 | Kamata | |
| 7,854,878 B2 | 12/2010 | Hedrick et al. | |
| 8,021,771 B2 | 9/2011 | Weller | |
| 9,437,358 B2 | 9/2016 | Kang | |
| 2006/0102871 A1 | 5/2006 | Wang et al. | |
| 2008/0090079 A1* | 4/2008 | Fajardo | B82Y 25/00 428/402 |
| 2009/0130425 A1* | 5/2009 | Whitaker | A63B 49/10 428/312.8 |
| 2010/0021985 A1* | 1/2010 | Mason | B82Y 25/00 435/174 |
| 2010/0261038 A1 | 10/2010 | Imaoka | |
| 2011/0186582 A1* | 8/2011 | Whitaker | B22F 7/004 220/563 |
| 2014/0132376 A1* | 5/2014 | Jin | H01F 1/0552 335/302 |
| 2014/0286817 A1* | 9/2014 | Kim | C23C 18/1635 419/38 |

FOREIGN PATENT DOCUMENTS

| | | |
|---|---|---|
| JP | 2013-065666 | 4/2013 |
| WO | 03071561 | 8/2003 |

OTHER PUBLICATIONS

Guan (Journal of Microelectromechanical Systems, vol. 15, No. 2, Apr. 2006) (Year: 2006).*

Katz, Joseph & Xing, Yangchuan & Cammarata, R . . . (1999). Magnetophoretic deposition of nanocomposites. Journal of Materials Research—J Mater Res. 14. 4457-4459. 10.1557/JMR.1999.0602 (Year: 1999).*

Kooij, E. S., Brouwer, E. A. M., Galea, A. C., & Poelsema, B. (2007). Field-assisted Nanocolloidal Self-assembly: Electrophoretic and Magnetopheretic Deposition. In E. A. Scarpetti (Ed.), Progress in Colloid and Surface Science Research (pp. 11-12). New York, USA: Nova Science. (Year: 2007).*

Qu Fabrication of CoNiMnP—BaFe12O19 nanocomposite coatings by electrodeposition, Transactions of the IMF, 90:2, 92-97 (Year: 2012).*

International Search Report, international Application No. PCT/US2014/048142, PCT/ISA/210, dated Nov. 27, 2014, 6 sheets.

Derwent Abstract Translation of WO 2012/159096 A1 (Derwent-Acc-No. 2012-Q30274) (pub. 2012).

JPO Abstract of JP 2001-323343 A (pub 2001).

* cited by examiner

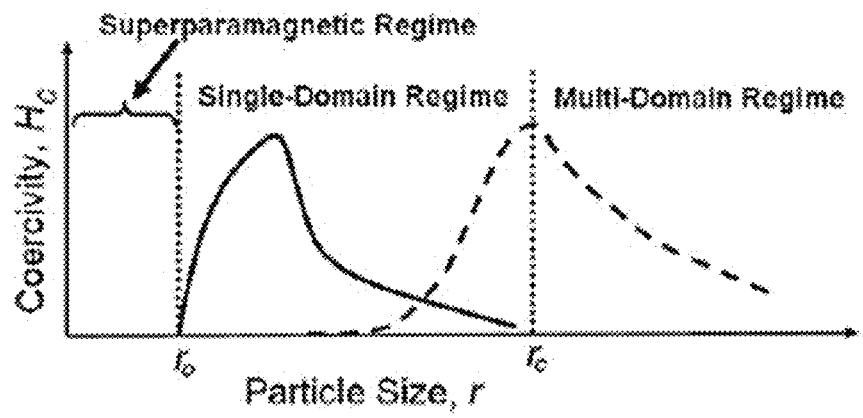
FIG. 3
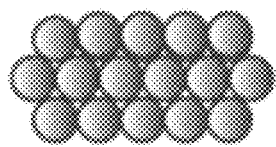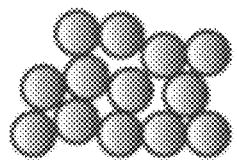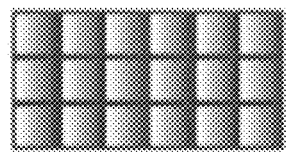
FIG. 4A     FIG. 4B     FIG. 4C

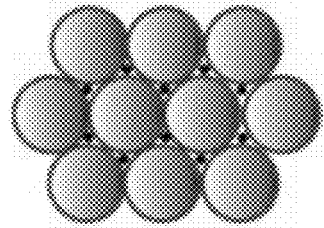 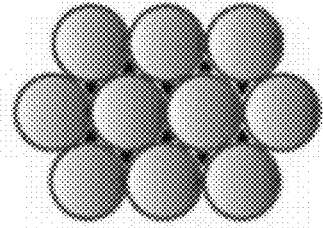
FIG. 4D  FIG. 4E
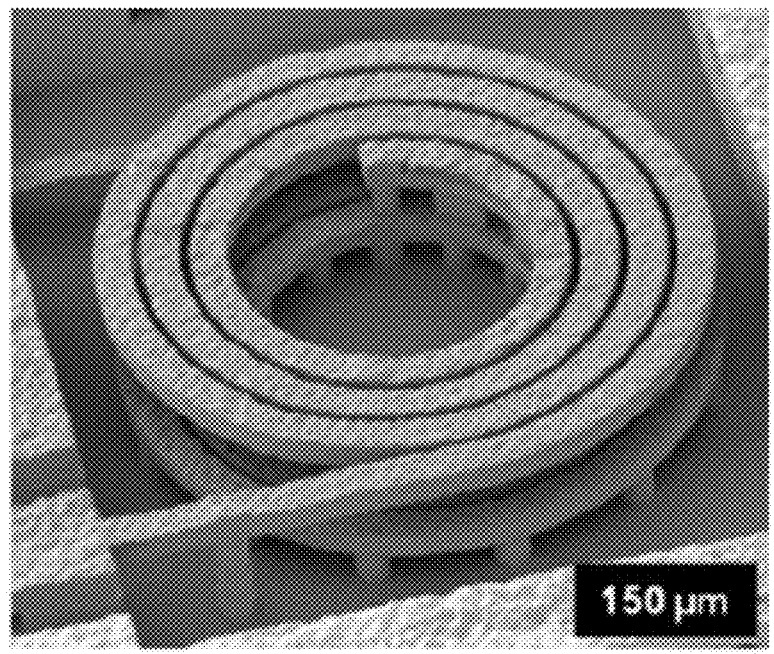
FIG. 5A

NANOCOMPOSITE MAGNETIC MATERIALS FOR MAGNETIC DEVICES AND SYSTEMS

CROSS-REFERENCE TO RELATED APPLICATIONS

The present application is a divisional application of U.S. application Ser. No. 14/904,887, filed Jan. 13, 2016, which is a national stage application of International Application No. PCT/US2014/048142, filed Jul. 25, 2014, which claims the benefit of U.S. Provisional Application Ser. No. 61/858,987, filed Jul. 26, 2013, the disclosures of each of which are hereby incorporated by reference in their entirety, including all figures, tables and drawings.

BACKGROUND

Magnetic materials are used in many different compact devices and systems. The magnetic materials of interest for these systems exhibit a ferromagnetic or ferrimagnetic response, and more specifically, a large magnetization in response to an applied magnetic field. These magnetic materials are generally sub-categorized into either soft magnetic materials, which have a lower coercivity (generally <1 kA/m), or hard magnetic materials, which have a higher coercivity (generally >10 kA/m).

Soft magnetic materials are used in a wide array of electronic devices. For example, power electronic circuits for power conversion and regulation often include magnetic passives such as inductors and transformers, which use soft magnetic materials in the inductor and transformer cores. Furthermore RF/microwave radio circuits for wireless connectivity utilize inductors and transformers, as well as phase shifters, circulators, and isolators, which also employ soft magnetic materials. These magnetic passives tend to be the largest, heaviest, and/or most inefficient system components of the circuits to which they form a part.

Limitations of magnetic materials used in soft magnetic cores for forming magnetic passives include magnetic saturation and core loss, particularly at high operational frequencies (1 MHz-10 GHz). In addition, core loss may be dominated by eddy current losses.

Hard magnetic materials (permanent magnet behavior) are also used in a wide variety of devices. For example, hard magnets supply the magnetic fields for electrodynamic or magnetic transduction in actuators, energy-converters, motors, and generators. Hard magnets are also used to provide bias fields or a fixed magnetic moment for magnetic field sensors, proximity sensors, biomedical devices, and other devices where a stable magnetic field is required. Hard magnets are also used to form magnetic latches.

Limitations of magnetic materials used in hard micromagnets include coercivity, remanence, maximum energy product, chemical stability (e.g. propensity for oxidation or corrosion), and temperature sensitivity.

One challenge in forming small-scale magnetic devices and systems is related to the dimensional requirements of the necessary magnetic materials. Magnetic structures with critical dimensions ranging from ones of micrometers up to hundreds of micrometers are desired, but these structural dimensions fall in a "technology gap" between thin-film processing and bulk manufacturing.

That is, bottom-up thin-film deposition processes do not easily yield thick enough magnetic layers (e.g., on the order of micrometers). Conversely, top-down machining of fine-scale structures from bulk materials is challenging, and assembly of these structures into functional devices requires extensive packaging overhead, which increase size and cost. Thus, it is difficult to achieve thick magnetic materials with good magnetic properties in a highly manufacturable process, since it is challenging to achieve both manufacturability and performance at the same time.

Because of this technology gap, magnetic materials remain notoriously difficult to integrate into planar substrate manufacturing processes such as wafer-level electronics manufacturing or printed-circuit-board manufacturing. Hence, these wafer-level and board-level integration challenges inhibit the use of magnetic materials in the formation of small-scale magnetic devices and systems.

Another challenge in manufacturing small-scale magnetic devices and systems in a manner that enables high-throughput as well as compatibility and integration with existing manufacturing platforms is that the material properties of a magnetic material are strongly coupled with the material synthesis/deposition process. Changing the thickness of a deposited magnetic film can alter the resulting material properties due to, for example, stoichiometry differences, stress, and shape anisotropy.

BRIEF SUMMARY nanocomposite magnetic materials, methods of manufacturing nanocomposite magnetic materials, and magnetic devices and systems using these nanocomposite magnetic materials are described.

One aspect of the present invention is directed toward nanocomposite magnetic materials that exhibit properties suitable for use in small-scale devices and systems. A nanocomposite magnetic material structure of certain embodiments can be of dimensions of 1 µm to 1 mm. The nanocomposite magnetic material can include a matrix phase and an inclusion phase. The matrix phase acts as a binder for the inclusion phase and can include magnetic material. The inclusion phase can include nanomaterials such as magnetic metal oxides, magnetic metal alloys, magnetic metal alloys with oxide shells, ceramics, or polymers. The inclusion phase nanomaterials may have a variety of sizes, shapes, surface coatings, and magnetic properties.

An electro-infiltration process can be performed to form the nanocomposite magnetic materials on planar substrates. The electro-infiltration process described herein can form dimensionally controlled sub-millimeter magnetic nanocomposite structures in a scalable, batch-fabrication manner. The magnetic structures can be employed to form magnetic devices (e.g., magnetic passives, magnetic actuators) and magnetic systems power conversion systems, magnetic sensor systems, biomedical devices).

Another aspect of the present invention is directed toward the electro-infiltration process to form the nanocomposite magnetic materials. In certain implementations, nanomaterials are first synthesized with tailored size, shape, magnetic properties, and surface chemistries. In some cases, monodisperse particles can be formed. Then, directed assembly methods, conducted at low temperatures, can be used to consolidate the nanomaterials (i.e., the inclusion phase) into porous microstructures on planar substrates. These porous structures can then be infiltrated with electroplated magnetic metals (i.e. the matrix phase) to form multi-phase nanocomposite magnetic materials with magnetic properties.

A further aspect of the present invention is directed to a magnetic device formed of the nanocomposite magnetic materials. The magnetic device may be, as an example, a transformer, an inductor, a radio frequency (RF) device, a microwave device, an actuator, a motor, a generator, or an energy converter.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 2A shows inclusion phase nanoparticles in a matrix; FIG. 2B shows inclusion phase core/shell nanoparticles in a matrix; FIG. 2C shows nanowires in a matrix; and FIG. 2D shows aligned nanowires in a matrix.

FIG. 3 is a schematic illustrating the strong dependence of coercivity on particle size.

FIGS. 4A-4E illustrate packing arrangements of particles that may be implemented based on particle size and shape.

FIGS. 5A-5C show example air-core inductor (FIG. 5A), transformer (FIG. 5B), and magnetically tunable phase shifter (FIG. 5C) configurations that may be fabricated on planar substrates and formed of the nanocomposite materials of certain embodiments of the invention.

FIG. 12A shows the real part $\mu_r'(\omega)$ and FIG. 12B shows the imaginary part $\mu_r''(\omega)$.

DETAILED DESCRIPTION

Nanocomposite magnetic materials, methods of manufacturing nanocomposite magnetic materials, and magnetic devices and systems using these nanocomposite magnetic materials are described.

According to certain embodiments, the nanocomposite magnetic material may be formed of a nanostructured inclusion phase and a matrix phase. The inclusion phase refers to the nanomaterials (i.e., "nanoparticles," "nanowires," "nanorods") and/or impurities forming the nanocomposite magnetic material. A nanomaterial is a material that has a structural dimension of <100 nm in at least one dimension. The matrix phase refers to the binding that creates a high-volume-density, high-magnetic-moment nanocomposite magnetic material. Thus, "matrix phase" and "binder" may be used interchangeably herein.

An electro-infiltration process is performed to form the nanocomposite magnetic materials on planar substrates. The electro-infiltration process can form dimensionally controlled sub-millimeter magnetic nanocomposite structures in a scalable, batch-fabrication manner. The magnetic structures can be employed to form magnetic devices (e.g., magnetic passives, magnetic actuators) and magnetic systems (e.g. power conversion systems, magnetic sensor systems, biomedical devices).

Figure 1A:
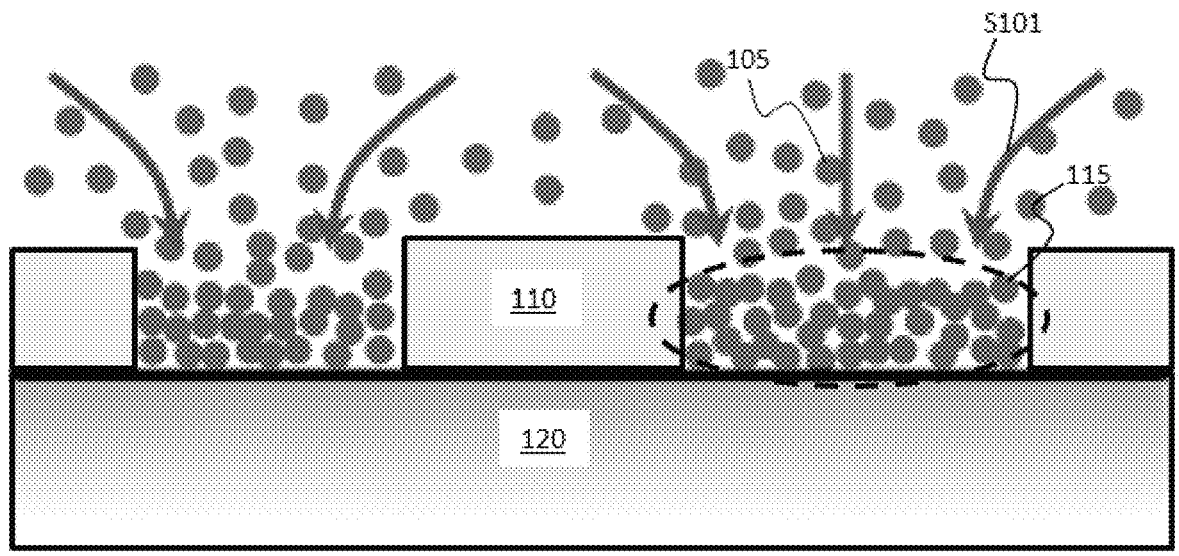
FIGS. 1A-1C illustrate a method of manufacturing a nanocomposite magnetic material according to an implementation of the invention.
Figure 1B:
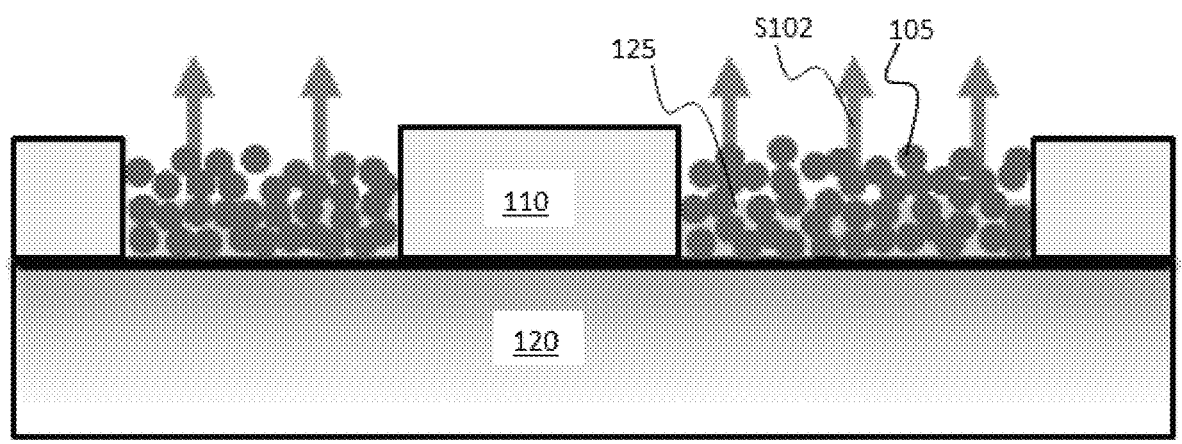
Figure 1C:
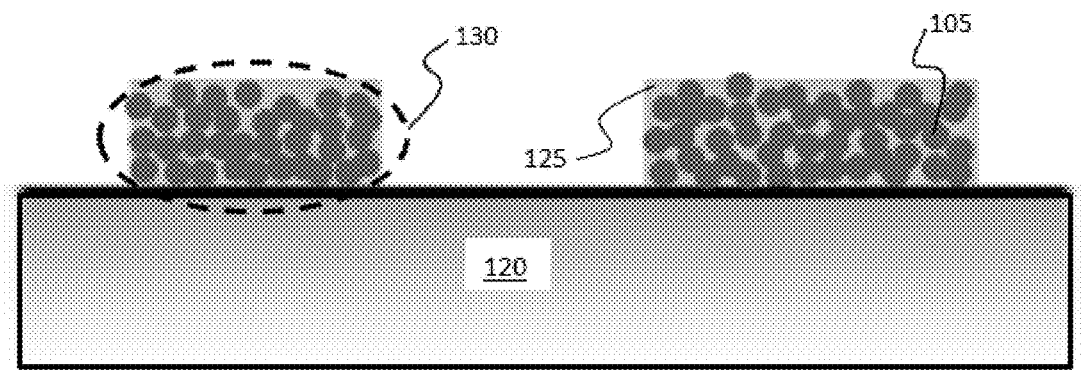

FIGS. 1A-1C illustrate a method of manufacturing a nanocomposite material according to an implementation of the invention. Referring to FIG. 1A, a nanomaterial inclusion phase can be assembled (S101). In some cases, the nanomaterial inclusion phase may be formed of multiple inclusion phases (or types of nanomaterials).

The assembly of nanomaterials 105 can be directed into structurally defined molds 110, forming porous microstructures ("particle consolidates") 115 on a planar substrate 120. The planar substrate 120 may be a silicon wafer, printed circuit board (PCB), lead-frame, or other circuit or package substrate. The structurally defined molds 110 may be formed of photoresist, etched into a layer of the substrate 120, or fabricated by any other suitable technique.

In certain implementations, the molds 110 may have plan view dimensions of any of the following values, about any of the following values, at least any of the following values, at most any of the following values, or within any range having any of the following values as endpoints, though embodiments are not limited thereto: 100 nm, 250 nm, 500 nm, 1 μm, 2.5 μm, 5 μm, 25 μm, 50 μm, 100 μm, 250 μm, 500 μm, 1 mm, 2.5 mm, 5 mm, 10 mm, 25 mm, 50 mm, 100 mm.

In some implementations, the molds may be omitted and the nanocomposite material formed directly on a substrate or structure.

The nanomaterials 105 may be directed into the molds 110 (or other structure when molds are not used), for example, via doctor Wading, mechanical compaction, direct-write (e.g. inkjet printing) technology, evaporative consolidation, electrophoretic deposition, or magnetophoretic deposition.

In electrophoretic deposition, colloidal particles in liquid medium migrate under the influence of an electric field and then deposit on the surface. An electric bias can be applied to a conductive seed layer on the substrate 120. In the presence of the electric bias, the particles can deposit on the exposed surfaces of the substrate 120. An ac electric field can be used to enact selective spatial deposition and to provide orientation of anisotropic particles such as ferrite nanowires. The electrophoretic deposition may be a two-step process where charged nanoparticles are placed in suspension and through e action of an electric field move toward and deposit on an oppositely charged surface.

Magnetophoretic deposition uses magnetic field gradients to attract the magnetic particles into the molds. In one approach, external magnets may be placed behind the substrate 120 and lateral agitation of these magnets can help confine the particles to the molds. If the particles remain stable in solution even in the presence of an external magnetic field, as is the case for ferrofluids, the ionic strength and pH of the solution can be adjusted to destabilize the particles leading them to agglomerate and settle. The external magnets can also be used provide a uniform magnetic field to align anisotropic particles such as ferrite nanowires to enable anisotropic composites. "Particles" may be of any shape and are not necessarily spherical.

The consolidated particles need to be very volumetrically dense. For example the target densities may be in the range of 25-50%, so that there is sufficient porosity for the electro-infiltration process to occur.

The inclusion phase of the nanocomposite magnetic material can include nanomaterials such as magnetic metal oxide, soft magnetic or hard magnetic metal alloy, magnetic metal alloy with an oxide shell, ceramics, or polymers. The inclusion phase nanomaterials may have a variety of sizes, shapes, surface coatings, and magnetic properties. These inclusion phase materials form a nanogranular dielectric phase that disrupts the formation of eddy currents, while also providing additional magnetic moment. In some implementations, the inclusion phase may be magnetostrictive.

For implementations using magnetic metal oxide for the nanomaterials, the nanomaterials may include $Ni_{1-x}Zn_x Fe_2O_4$ (where $0 \leq x \leq 1$) or $Mn_{1-x}Zn_xFe_2O_4$ (where $0 \leq x \leq 1$). For implementations using magnetic metal alloy for the nanomaterials, soft magnetic material such as Ni, Fe, Co, NiFe, CoFe, or other transition metal magnetic alloys; or hard magnetic material such as CoNi, CoPt, FePt, NdFeB, SmCo, or other transition metal or rare-earth-based magnetic alloy, may be included. For implementations using magnetic metal alloy with an oxide shell, the metal alloy can be formed with an oxide surface layer in air or via chemical synthesis.

Referring to FIG. 1B, a magnetic metal matrix 125 can be electroplated up (S102) from the substrate 120, filling in the void spaces of the porous microstructure 115. Electroplating can use an electric current to reduce metal ions from a solution (such as an electrolyte) and deposit a dense metal coating on a conducting surface. For surfaces that are not highly conducting (such as an oxide surface or a silicon surface), a seed layer of a metal can be sputtered or evaporated onto the surface. In some cases, the electroplating may be steady electroplating, for example constant current electroplating (galvanostatic) or constant voltage electroplating (potentiostatic). In other cases, the electroplating may be pulse or pulse-reverse plating. Alternatively, electroless plating techniques may be used to infiltrate the porous microstructure. This step (S102) can be referred to as electro-infiltrating a metal matrix. That is, "electro-infiltrating" refers to a process by which metal is electroplated up through a porous microstructure. Both electroplating and electro-less plating are contemplated as being processes available for "electro-infiltrating" the metal matrix up through a porous microstructure.

The magnetic metal matrix 125 (matrix phase) may be selected to provide a high-saturation, low-coercivity magnetic property for the nanocomposite. For example, the matrix phase, or binder, may be magnetic and include soft magnetic material such as Ni, Fe, Co, NiFe, CoFe, or other transition metal magnetic alloys.

The magnetic metal matrix 125 (matrix phase) may be selected to provide a high-saturation, high-coercivity or hard magnetic property for the nanocomposite. For example, the matrix phase, or binder, may be magnetic and include hard magnetic material such as CoNi, CoPt, FePt, NdFeB, SmCo, or other transition metal or rare-earth-based magnetic alloy.

In some implementations, the matrix phase may be magnetostrictive.

After performing the electro-infiltrating process, the molds (110)—if used—may be removed and additional processes performed. The result of electro-infiltrating the porous microstructure 115 of a nanomaterial inclusion phase with a metal matrix 125 is a two-phase nanocomposite 130 as shown in FIG. 1C. The nanomaterials, or inclusion phase, may have a fill fraction (volume ratio) in the magnetic matrix in a range of 20-65% by volume. In some embodiments, the volume ratio for the nanomaterial is 20-40% by volume, 40-60% by volume, 60-80% by volume, or 80-95% by volume.

In certain implementations, the thickness of the two-phase composite 130 can be any of the following values, about any of the following values, at least any of the following values, at most any of the following values, or within any range having any of the following values as endpoints, though embodiments are not limited thereto: 100 nm, 250 nm, 500 nm, 1 µm, 2.5 µm, 5 µm, 25 µm, 50 µm, 100 µm, 250 µm, or 500 µm. In some cases, the two-phase composite 130 is formed to a thickness between about 100 nm and about 5 µm. In some cases, the two-phase composite 130 is formed to a thickness between about 5 µm to about 50 µm. In some cases, the two-phase composite 130 is formed to a thickness between about 50 µm and 500 µm.

Figure 2A:
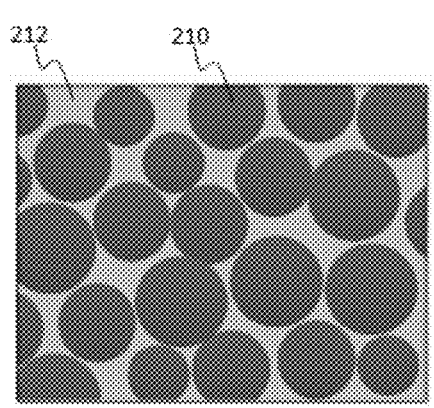
FIGS. 2A-2D illustrate nanocomposite magnetic materials according to some implementations of the invention.
Figure 2B:
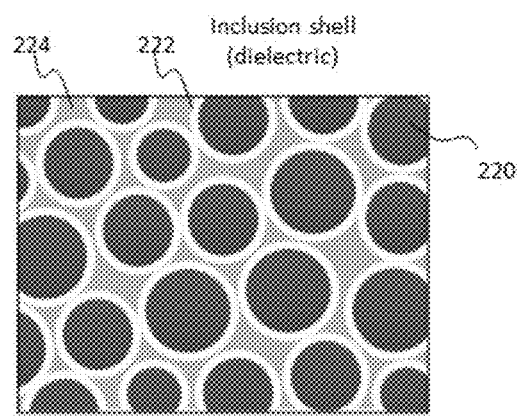

FIGS. 2A-2D illustrate nanocomposite structures according to some implementations of the invention. Referring to FIG. 2A, inclusion phase nanomaterial 210 having spherical shapes may be included in a matrix 212. Referring to FIG. 2B, inclusion phase core/shell nanomaterial formed of a magnetic nanomaterial 220 having a shell 222 that may be formed of a dielectric can be included in a matrix 224.

This shell 222, which may be a surface oxide layer, affects the material's ferromagnetic resonance as well as the overall electrical conductivity of the nanocomposite material. When the magnetic nanomaterial is formed of magnetic metal alloy, the ferromagnetic resonance properties of the nanomaterial can be controlled, in some embodiments, through controlling the thickness of the dielectric (e.g., oxide) coating that forms the shell 222 of the of the magnetic metal alloy nanomaterial. Magnetic metal alloy nanomaterial having controllable oxide shell thicknesses can be used in fabricating nanocomposite magnetic materials for devices, such as microinductors, for high-frequency applications. For example, a dielectric coating may be formed on Fe—Co alloy nanoparticles by reacting the surface with corresponding metal oxide precursors, resulting in an amorphous oxide coated shell. For some implementations using magnetic metal alloy nanomaterial having controllable oxide shell thicknesses, the oxide shell may be formed to thicknesses including, but not limited to about 0.5, 1, 2, 3, 4, 5, 6, 7, 8, 9, 10, 20 (all values in nm), for example between 1 nm to 10 nm, inclusive.

Figure 2C:
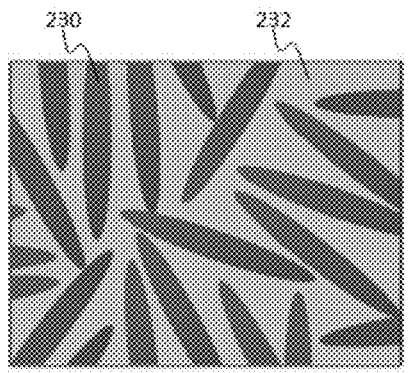
Figure 2D:
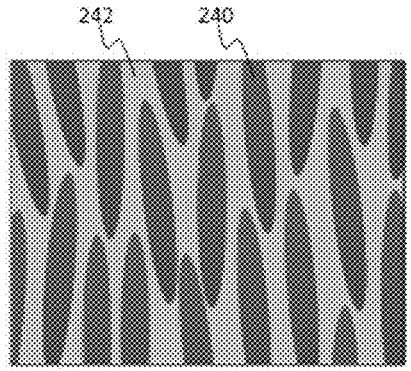

Referring to FIG. 2C, nanowires 230 can be included in a matrix 232. Referring to FIG. 2D, the nanowires can be aligned nanowires 240 in a matrix 242.

As illustrated in FIGS. 2A-2D, the nanocomposite magnetic material can include a matrix phase and an inclusion phase. The matrix phase acts as a binder for the inclusion phase and can include magnetic material.

The nanocomposite magnetic materials can be formed of nanomaterials that are synthesized with tailored size, shape, magnetic properties, and surface chemistries. The synthesized materials of the inclusion phase may be magnetic nanomaterials (providing a conductively disruptive magnetic phase) that can then be consolidated into porous microstructures via a directed assembly method. The porous microstructures can be infiltrated with electroplated ferromagnetic metals to form multi-phase (or "nanocomposite") magnetic materials.

With reference to FIGS. 2A and 2B, the magnetic nanomaterial may be in a shape of a nanoparticle with diameters of, for example, any of the following values, about any of the following values, at least any of the following values, at most any of the following values, or within any range having any of the following values as endpoints, though embodiments are not limited thereto (all numerical values are in nanometers): 1, 2, 3, 4, 5, 6, 7, 8, 9, 10, 15, 20, 25, 30, 40, 50, 100, 150, 200, 250, 300, 350, 400, 410, 420, 430, 440, 450, 460, 470, 480, 490, or 500. For example, the nanoparticle diameters can be in a range of 1-10 nm, 5-50 nm, 10-50 nm, 50-100 nm, or 100-500 nm. In some cases, all nanoparticles are of a diameter within 10% of each other. In some cases, the nanoparticle diameters used for forming a nanocomposite material are within any of the ranges.

The magnetic nanomaterial may be in a shape of a nanoflake or nanodisc with thicknesses of, for example, any of the following values, about any of the following values, at least any of the following values, at most any of the following values, or within any range having any of the following values as endpoints, though embodiments are not limited thereto (all numerical values are in nanometers): 1, 2, 3, 4, 5, 6, 7, 8, 9, 10, 15, 20, 25, 30, 40, 50, 60, 70, 80, 90, or 100. The nanoflakes or nanodiscs may have a diameter of, for example, any of the following values, about any of the following values, at least any of the following values, at most any of the following values, or within any range having any of the following values as endpoints, though embodiments are not limited thereto (all numerical values are in nanometers): 1, 2, 3, 4, 5, 6, 7, 8, 9, 10, 15, 20, 25, 30, 40, 50, 100, 150, 200, 250, 300, 350, 400, 410, 420, 430, 440, 450, 460, 470, 480, 490, 500, 550, 600, 650, 700, 750, 800, 850, 900, 950, 1000, 1500, 2000, 3000, 4000, 5000.

For example, the thicknesses can be in a range of: 1-10 nm; 10-50 nm; or 50-100 nm; and the diameters may be in a range of: 10-50 nm; 50-100 nm; 100-500 nm; 500-1000 nm; or 1000-5000 nm. In some cases, the nanoflakes or nanodiscs of a particular material are of a thickness within 10% of each other and/or diameter within 10% of each other. In some cases, the nanoflake or nanodisc thicknesses and/or diameters used for forming a nanocomposite material are within any of the ranges.

With reference to FIGS. 2C and 2D, the magnetic nanomaterial may be in a shape of a nanorod or nanowire with diameters of, for example, any of the following values, about any of the following values, at least any of the following values, at most any of the following values, or within any range having any of the following values as endpoints, though embodiments are not limited thereto (all numerical values are in nanometers): 1, 2, 3, 4, 5, 6, 7, 8, 9, 10, 15, 20, 25, 30, 40, 50, 100, 150, 200, 250, 300, 350, 400, 410, 420, 430, 440, 450, 460, 470, 480, 490, 500, 550, 600, 650, 700, 750, 800, 850, 900, 950, 1000. For example, the nanorod or nanowire diameters can be in a range of: 10-50 nm, 50-100 nm, 100-500 nm, or 500-1000 nm. In some cases, the nanorods or nanowires are of a diameter within 10% of each other. In some cases, the nanorods or nanowire diameters used for forming a nanocomposite material are within any of the ranges.

The nanorods or nanowires may have a length of, for example, any of the following values, about any of the following values, at least any of the following values, at most any of the following values, or within any range having any of the following values as endpoints, though embodiments are not limited thereto (all numerical values are in nanometers): 1, 2, 3, 4, 5, 6, 7, 8, 9, 10, 15, 20, 25, 30, 40, 50, 100, 150, 200, 250, 300, 350, 400, 410, 420, 430, 440, 450, 460, 470, 480, 490, 500, 550, 600, 650, 700, 750, 800, 850, 900, 950, 1000, 1500, 2000, 3000, 4000, 5000, 6000, 7000, 8000, 9000, $10^4$, or $10^5$. For example, the nanorod or nanowire lengths can be in a range of: 50-100 nm, 100-500 nm, 500-1000 nm, 1-5 µm, 5-10 µm, or 10-50 µm. In some cases, the nanorods or nanowires are of a length within 10% of each other. In some cases, the nanorod or nanowire lengths used for forming a nanocomposite material are within any of the ranges. It can be appreciated that the terms "nanorod" and "nanowire" refer to a same shape and may be used interchangeably as a matter of preference.

In some implementations, the magnetic nanomaterial of the inclusion phase may be provided as a fiber mesh. A fiber mesh can be in the form of a random mesh or an aligned mesh, either configuration fabricated by electrospinning. The fiber mesh can be formed of metal oxide (e.g., synthesized magnetic metal oxide), polymer or a polymer composite (a polymer with another material embedded).

Thus, the magnetic nanomaterials for the inclusion phase of the nanocomposite material can be formed in a range of sizes and shapes, including spherical, prismadic, and cubic. Example shapes include nanoparticle, nanoflake, nanodisc, nanorod, and fiber mesh.

For an isolated magnetic nanomaterial, permeability and coercivity of the nanomaterials are strongly related to the particle size. Below a certain size, the material will exhibit superparamagnetic behavior, with zero coercivity and higher-than-bulk permeability. Above this superparamagnetic limit, the particle exhibits either single-domain or multi-domain magnetic behavior, with size-dependent magnetic properties. In other words, controlling the size of a particle can have a dramatic effect on magnetic properties of the particle.

As shown in FIG. 3, below a certain particle size (typically 3-20 nm), the particles may exhibit superparamagnetic behavior, with zero coercivity. Above this superparamagnetic size, the particles may exist in either a single-domain or multi-domain regime, with size-dependent magnetic properties.

FIGS. 4A-4E illustrate packing arrangements of particles that may be implemented based on particle size and shape. FIG. 4A depicts close-packed nanoparticles of spherical particles having similar size and shape. A close-packed configuration may be arranged using an external magnetic field. FIG. 4B depicts random close-packing of monodisperse spherical particles. FIG. 4C illustrates the use of cubic nanoparticles of ferrites fabricated with narrow size distribution, enabling a higher fill fraction as compared to close-packing of spherical particles. Heterogeneous mixtures of nanomaterial with differing sizes may increase fill fraction. Smaller particles—either spherical as shown in FIG. 4D or prism-shaped as shown in FIG. 4E can be size-selected to fill the voids between the larger particles and enhance the total density.

For nanomaterial embedded in a magnetic matrix, an inter-phase magnetic exchange coupling phenomenon may occur between particles and at interfaces between two magnetic material phases. Exchange coupling is a quantum mechanical effect, wherein the magnetic moment of one atom tends to align the magnetic moment of a neighboring atom, giving rise to ferromagnetic behavior. A magnetic material possesses a characteristic exchange length $L_{ex}$ which represents the minimum scale over which the magnetization can vary appreciably. For Co-based alloys, the exchange length is about 5-10 nm and for Fe-based alloys, the exchange length is about 20-40 nm.

Thus, for closely packed particles, inter-particle exchange coupling can significantly change the net material behavior. In particular, when the particle size D is scaled down to the exchange length scale, exchange coupling will dominate over magnetocrystalline anisotropy or other traditionally dominant magnetic effects. In this regime, the coercivity scales radically as $H_c \propto D^6$, and the permeability as $\mu_r \propto 1/D^6$.

Therefore, denser packing of the particles increases not only the magnetization, but also reduces the coercivity due to inter-particle exchange coupling. For example, 20 nm $Fe_{10}Co_{90}$ precursor nanoparticles exhibited a coercivity of 150 Oe (12 kA/m), but after a plasma pressure compaction, the coercivity dropped by 30× to only 5 Oe (~400 A/m). High-frequency inductor applications are benefited by low coercivity in the magnetic nanomaterials. The particle size can therefore be considered and selected based on the exchange length so that the material acts as a fully interacting composite instead of a simple mixture of two phases.

The magnetic properties of the nanocomposite magnetic materials can be nano-engineered by tailoring sizes of individual nanoparticles, controlling packing density of the two-phase nanocomposite, and inclusion of nanoparticles in a ferromagnetic matrix.

In addition to different sizes and shapes, surface chemistry (including particle surface charge, i.e., zeta potential) of the nanoparticles may be varied to control assembly and packing efficiency (e.g., for particle consolidation). The nanoparticles with different surface coatings such as hydrophilic, hydrophobic, anionic, cationic are synthesized. For some of these surface coatings, environmental factors, for example, nonsolvents, salts, external fields, influence the stability of the particles in a colloidal suspension. External cues can then be used to trigger precipitation and consolidation. In the case of a hydrophilic polymer coating, a nonpolar solvent could be used to destabilize the particle dispersion allowing the precipitation of the particles. The zeta potential can be varied by the surface functionalization during the particle synthesis or by tuning the solvent properties such as pH and ionic strength.

The packing of magnetic particles can be further controlled when these destabilizing efforts are performed in the presence of an external magnetic field. In a colloidal suspension of magnetic nanoparticles, an external magnetic field can affect particle stability. A strong magnetic field can destabilize the particles, causing them to fall out of suspension. With modified field patterns, the kinetics of assembly may be varied and an optimum field strength for maximum packing is obtained.

Additionally, because the particles are magnetic, external magnetic fields can be used to beneficially assist the consolidation. Simple uniform magnetic fields can induce anisotropy, creating textured compacts with high permeability and low loss in a preferred easy axis. In addition, the magnetic particles can be assembled into close-packed superlattices in the presence of a magnetic field.

As mentioned with respect to FIG. 1A, magnetophoretic assembly using magnetic field gradients can be performed to attract the magnetic nanomaterial together (and in some cases into the molds). In one implementation, magnets can be placed behind the substrate, and lateral agitation of these assembly magnets can help confine the nanomaterial into the molds. In implementations using nanowire-shaped nanomaterial, a uniform magnetic field may be used to align the nanowires to enable anisotropic composites, for example as shown in FIG. 5D.

Electrostatic forces can also be used to assist the nanoparticle consolidation. For example, particles can be prepared with anionic and cationic surface functionalization. When mixed, Coulombic attraction between the positively and negatively charged particles leads to their precipitation and consolidation. If the Coulombic attraction is not sufficient to lead to consolidation, salts can be added to the solution to promote precipitation.

Once the nanocomposite structures are fabricated, RF/microwave and power converter devices and systems may be fabricated using planar-substrate manufacturing methods. Magnetic devices such as transformers and inductors can be fabricated from the structured nanocomposite magnetic materials, for example through silicon microfabrication techniques and/or printed-circuit board processes to form suitably sized coils. A substrate, such as a silicon substrate, may be etched and the nanocomposite materials deposited into the trenches forming the magnetic structures. The described electro-infiltration process can be inserted as a unit-process within a more complex microelectronic fabrication and/or PCB manufacturing process.

According to certain implementations, all of the steps of the electro-infiltration process can be performed at low-temperature (e.g., less than 80° C.).

In certain implementations, the electro-infiltration process can facilitate integration of high-performance magnetic materials with traditional semiconductor and PCB fabrication platforms. The electro-infiltration process can be used to embed a wide variety of nanomaterials within a metal matrix for realization of a broad array of materials, devices, and systems. In certain implementation, the nanocomposite materials can be integrated with semiconductor devices. Semiconductor devices, with which the nanocomposite materials can be integrated, include, but are not limited to, transistors, integrated circuits, optoelectronics, microelectromechanical systems (MEMS), sensors, actuators, or energy converters.

Figure 5B:
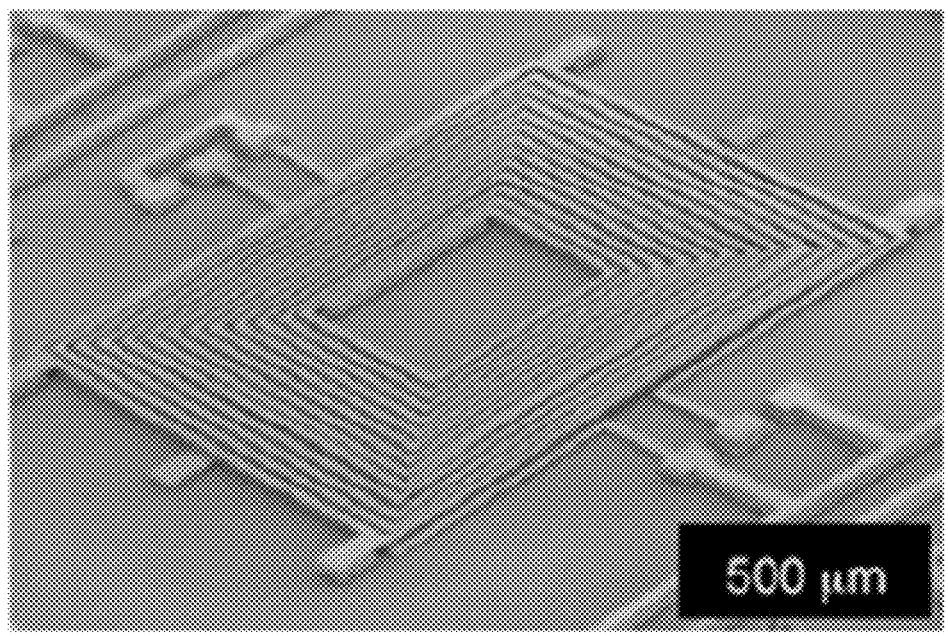

FIGS. 5A and 5B show example air-core inductor and transformer configurations that may be fabricated on planar substrates and formed of the nanocomposite materials. FIG. 5A is an image of a multi-layer, multi-turn electroplated inductor; and FIG. 5B is an image of a multi-layer, multi-turn electroplated transformer. These images are intended to illustrate device configuration that may be available when fabricating a device or system with nanocomposite materials as described herein. Architectures such as multi-turn, spiral coils can be fabricated with central cores, half-slab cores, or complete cores. In addition, solenoid or toroidal architectures may also be fabricated.

The power inductors can be designed and fabricated for power systems in a range of 1-1000 W. Advantageous performance enhancement is achieved by use of magnetic nanocomposite materials, particularly for next-generation power magnetic devices operating in a switching frequency range of 1-500 MHz.

Figure 5C:
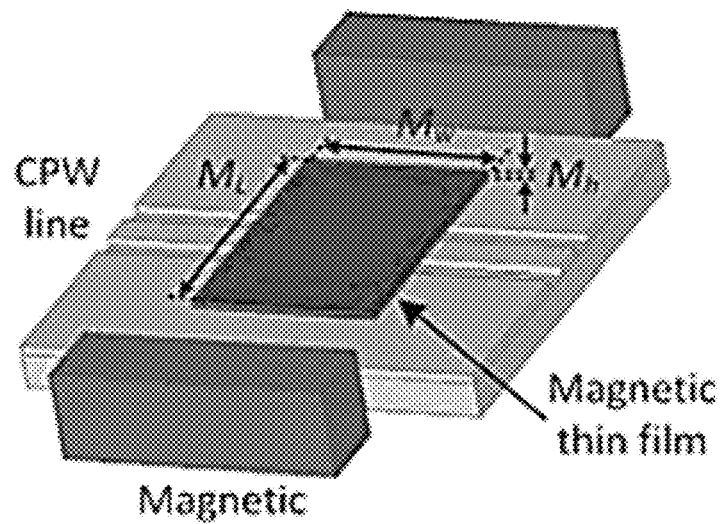

FIG. 5C shows a schematic of a magnetically tunable phase shifter that may be fabricated on planar substrates and formed of the nanocomposite materials described herein. The magnetically tunable phase shifter is suitable for phase control of an array antenna. To form the phase shifter, a coplanar waveguide can be fabricated in an RF circuit board, and then coated with a thin dielectric isolation layer such as epoxy or parylene. A nanocomposite magnetic patch is then integrated on the top surface of the waveguide. For tunability, the phase shifter device may be placed between a pair of Helmholtz coils or a pair of permanent magnets, to establish a transverse, in-plane magnetic field. By biasing with different magnetic fields, the nanocomposite will exhibit different effective magnetic permeability, which alters the wave speed along the waveguide, resulting in a phase change. A fabricated prototype showed a relative permeability of 1, 10, and 100 (tuned by the bias magnets) and simulated phase angle changes were 35°, 40°, and 48°, respectively. Such a device can perform in the low-GHz frequency range.

Using these nanocomposite materials, transformative magnetic performance, such as high saturation and low core loss, are achieved by a highly manufacturable process. For example, soft magnetic cores with a unique combination of magnetic properties such as saturation magnetization $B_s$>0.8 T, lore loss $H_c$<250 A/m, permeability $\mu_r$>50, and resistivity $\rho$>0.1 Ω·m, may be formed.

Transformative hard magnetic properties, such as high saturation and high coercivity, can also be achieved by creating exchange spring permanent magnets, where the nanomaterial inclusion phase is a hard magnetic material, and the matrix or binder is a soft magnetic material. For example, permanent magnets with remanence Br>1.2 T, intrinsic coercivity $H_{ci}$>800 kA/m, and maximum energy product >400 kJ/m$^3$, may be formed.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Example 1

Fabrication of Soft Magnetic Nanocomposite Materials

For the example demonstration, 30 nm maghemite ($\gamma$-Fe$_2$O$_3$) particles (inclusion phase) were evaporatively consolidated into photoresist molds on a silicon substrate, and then electro-infiltrated by a low coercivity, high saturation Fe—Co alloy (matrix phase) to illustrate fabrication of soft magnetic nanocomposite materials up to about 10 μm thick.

The non-conductive iron oxide particles inhibit formation of eddy currents that could be caused by a uniform Fe—Co alloy.

To form the nanocomposite material materials, silicon substrates were sputtered with a Ti/Cu seed layer (e.g., of about 100 nm). Then, photoresist patterns were formed on the surface to form photoresist molds. The nanoparticles ($\gamma$-Fe$_2$O$_3$ particles) were dispersed into deionized water and then dispensed into the molds, followed by evaporation to consolidate the particles into the molds. This process provided sufficient particle stability via van der Waals attraction forces for electroplating with the Fe—Co alloy. The Fe—Co alloy was electroplated up from the bottom surface via constant-current plating, and then the photoresist molds were removed using acetone.

In more detail for the example demonstration, maghemite ($\gamma$-Fe$_2$O$_3$) nanoparticles with a nominal diameter of 30 nm were used as the inclusion phase, and a low-coercivity, high-saturation Fe—Co alloy was used as the electro-infiltrated matrix phase. A (100) silicon wafer was sputtered with a 20-nm-thick adhesion layer of Ti and a 100-nm-thick seed layer of Cu. Then AZ 9260 (Shipley) photoresist molds with a thickness of 11.5 μm were patterned into various shapes and sizes on the surface using standard photolithographic techniques.

The 30-nm-diameter $\gamma$-Fe$_2$O$_3$ nanoparticles (Aldrich-Sigma #544884) were dispersed into deionized (DI) water and then manually dispensed via pipette onto the substrate, followed by evaporation to consolidate the particles into the molds. The water was evaporated either at room temperature for ~1 hr or by mild heating at 60-70° C. for several minutes. This process provides sufficient particle stability/bonding for the subsequent infiltration step. The substrate was next dipped into isopropanol in order to "wet" the nanoparticles and then soaked in DI water to displace the isopropanol before the electroplating process.

The Fe—Co alloy was electroplated up from the Ti/Cu seed layer via constant-current plating with the current density set as 5-20 mA/cm$^2$. Finally the photoresist molds were stripped in acetone, and the samples were cleaned with isopropanol and then placed into DI water in a sonication bath to remove any excess, unbound nanoparticles on the surface.

Figure 6A:
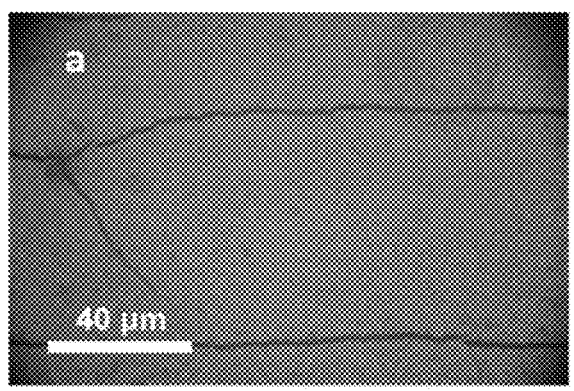
FIGS. 6A and 6B respectively show images of the surface of a sample before and after the electro-infiltration step
Figure 6B:
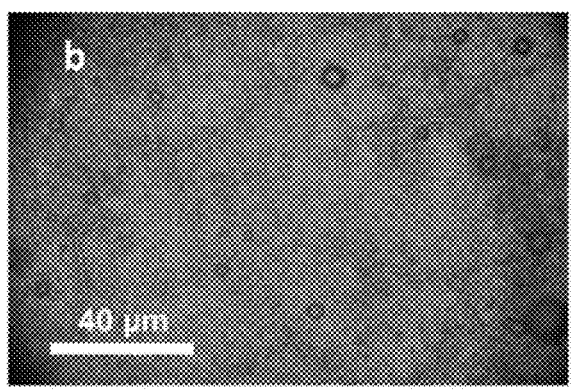

FIGS. 6A and 6B respectively show images of the surface of a sample before and after the electro-infiltration step. Some cracks are noted in the consolidated particle layer, whereas the infiltrated nanocomposite exhibits a fairly uniform surface morphology. For later calculation of magnetization and permeability, the sample volume is determined from the sample area and the average layer thickness, measured by both microscopy and profilometry. It is worth noting that the superparamagnetic limit for maghemite nanoparticles is about 30 nm, which contributes to the magnetic linkages that keep the particles bound in place. For other materials and particle sizes, additional steps, such as lower temperature (~200° C.) sintering or the use of a magnetic back-electrode, may be included to ensure that the consolidated nanoparticle templates remain in place.

Figure 7:
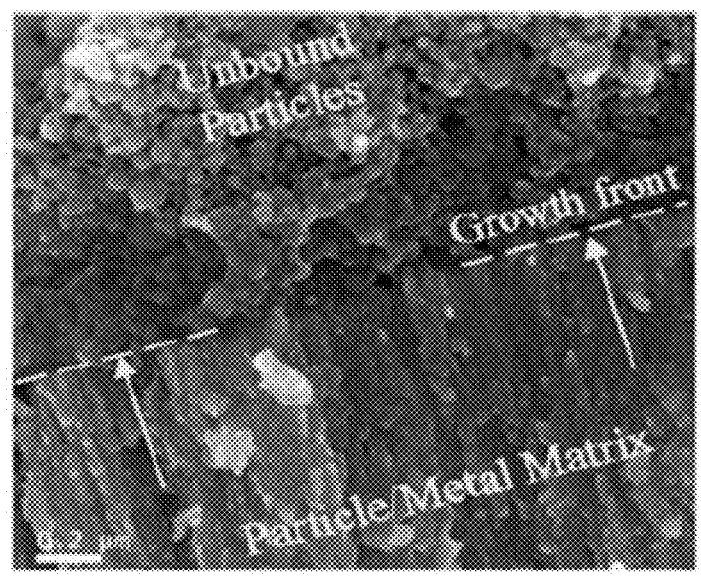
FIG. 7 is a scanning electron microscopy (SEM) image of a cleaved sample cross-section of a nanocomposite showing the progression of the electroplating growth front moving up through the nanoparticles.

FIG. 7 is a SEM image of a cleaved sample cross-section of a nanocomposite showing the progression of the electroplating growth front moving up through the nanoparticles. As can be seen from FIG. 7 (and verified using EDS elemental mapping), Fe—Co metal grows up from the substrate surface and encapsulates the Fe$_2$O$_3$ nanoparticles in the electroplating growth front, as opposed to heaving or displacing the particles out of the way.

Figure 8:
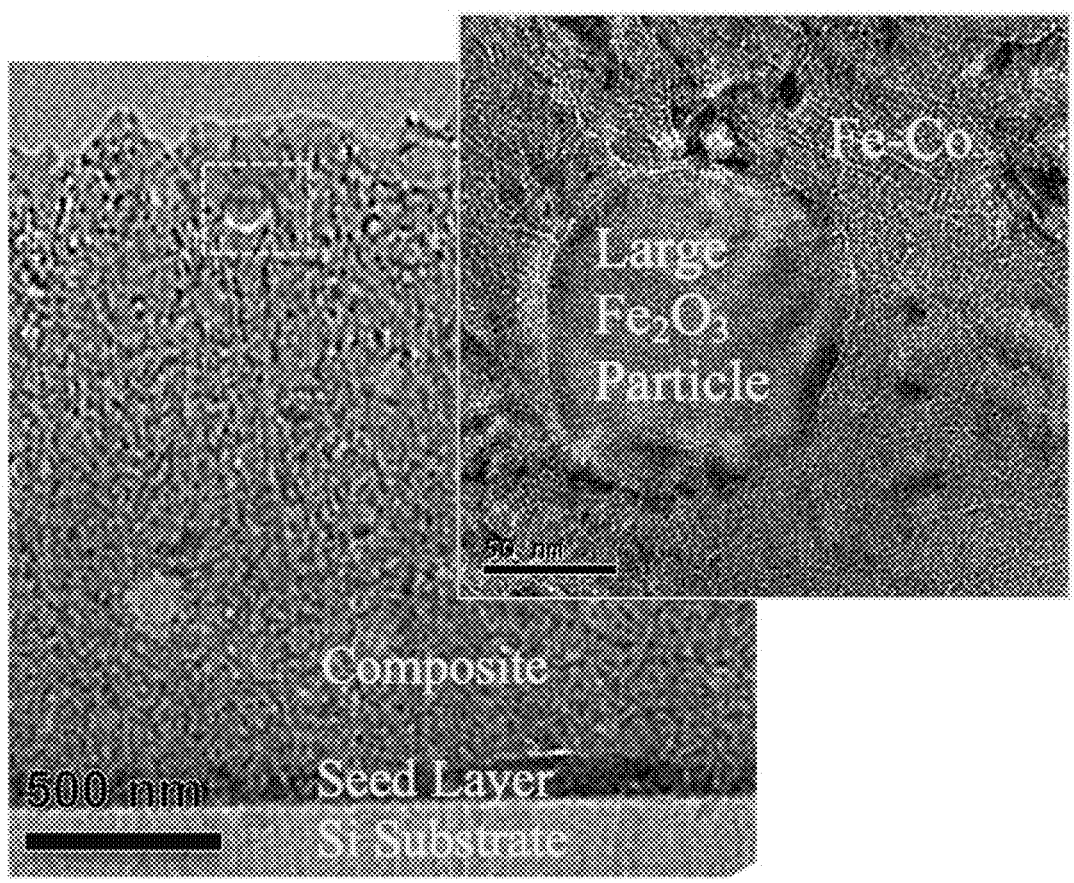
FIG. 8 is a transmission electron microscopy (TEM) image of a sample cross-section showing a dense composite with intimate phase boundaries (inset).

FIG. 8 is a TEM image of a sample cross-section showing a dense composite with intimate phase boundaries (inset). The cross-section shown in FIG. 8 indicates a dense composite, with no apparent pores in the 2-μm-thick, electro-infiltrated layer. The inset shows an intimate phase boundary between a single Fe$_2$O$_3$ particle and the surrounding Fe—Co matrix.

Experiments were conducted for three test structures. In particular, a vibrating sample magnetometer (VSM) (ADE Technologies, Model EV9) was used to measure the in-plane magnetization loops (along the long axis) of three different rectangular (12 mm×5 mm) test structures: an electroplated Fe—Co thin film (7.5 μm thick), a consolidated $\gamma$-Fe$_2$O$_3$ nanoparticle layer (7.0 μm) without electro-infiltration, and an electro-infiltrated $\gamma$-Fe$_2$O$_3$/Fe—Co nanocomposite (1.7 μm). Additionally a "double layer" sample was fabricated. The double layer was formed as a layer of consolidated $\gamma$-Fe$_2$O$_3$ nanoparticles (16 μm) on top of a layer of electroplated Fe—Co (0.4 μm), wherein the saturated magnetic moments of each layer are of similar magnitude.

Figure 9:
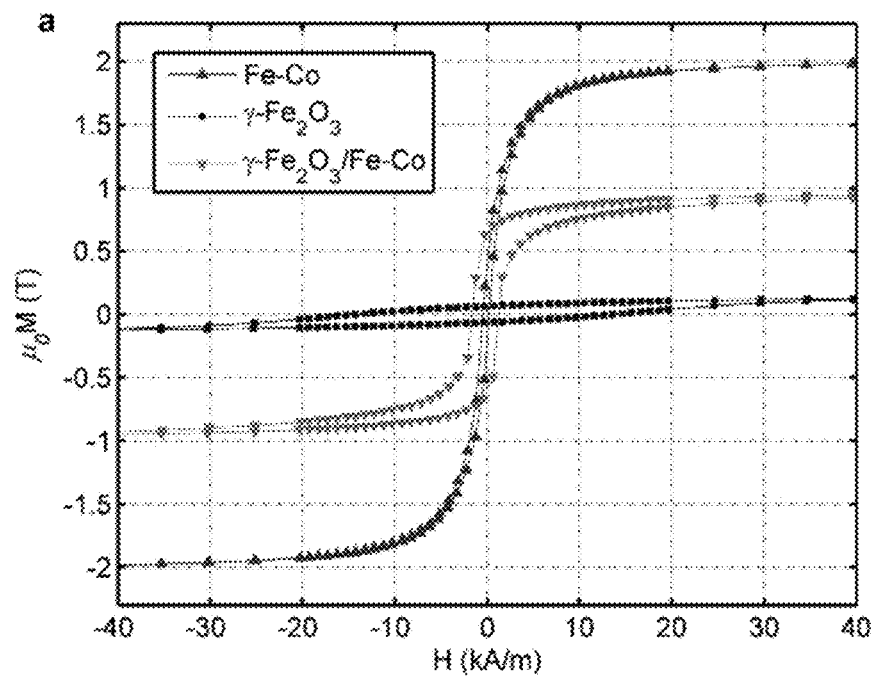
FIG. 9 shows a plot of hysteresis loops of electroplated Fe—Co layer, $\gamma$-Fe$_2$O$_3$ nanoparticle layer, and $\gamma$-Fe$_2$O$_3$/Fe—Co nanocomposite layer.
Figure 10A:
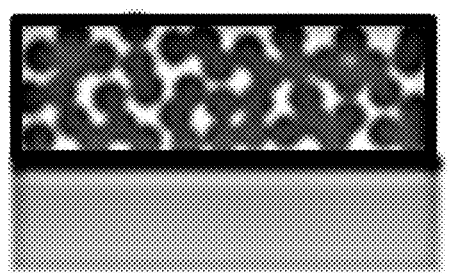
FIGS. 10A and 10B show schematic representations of a $\gamma$-Fe$_2$O$_3$/Fe—Co nanocomposite layer and a $\gamma$-Fe$_2$O$_3$/Fe—Co double layer, respectively.
Figure 10B:
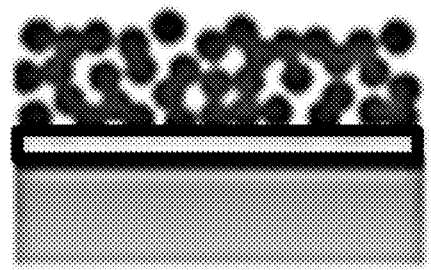
Figure 11:
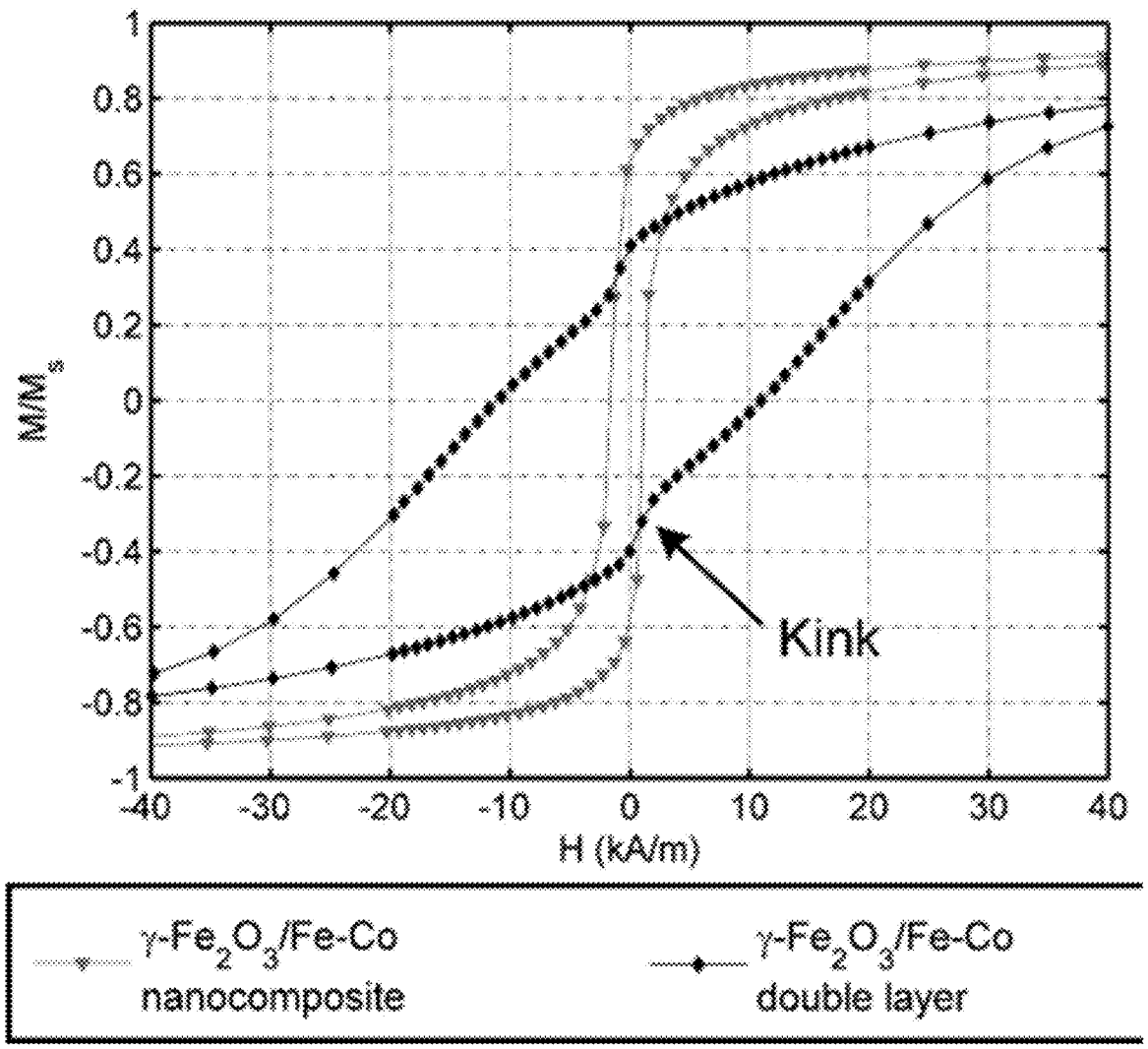
FIG. 11 shows a comparison of normalized hysteresis loops of the $\gamma$-Fe$_2$O$_3$/Fe—Co nanocomposite and $\gamma$-Fe$_2$O$_3$/Fe—Co double layer.

FIG. 9 shows a plot of hysteresis loops of electroplated Fe—Co layer, $\gamma$-Fe$_2$O$_3$ nanoparticle layer, and $\gamma$-Fe$_2$O$_3$/Fe—Co nanocomposite layer. FIGS. 10A and 10B show schematic representations of a $\gamma$-Fe$_2$O$_3$/Fe—Co nanocomposite layer and a $\gamma$-Fe$_2$O$_3$/Fe—Co double layer, respectively. FIG. 11 shows a comparison of normalized hysteresis loops of $\gamma$-Fe$_2$O$_3$/Fe—Co nanocomposite and double layer. The arrow indicates a kink on the double layer curve.

Referring to FIG. 9, the $\gamma$-Fe$_2$O$_3$/Fe—Co nanocomposite exhibits a saturation of 1.0 T, half that of the Fe—Co (2.0 T). This saturation value is much higher than a bulk ferrite (0.3-0.45 T) and on par with permalloy (~1.0 T). In addition, the coercivity of the $\gamma$-Fe$_2$O$_3$/Fe—Co nanocomposite is 1.5 kA/m, which is an order of magnitude lower than the $\gamma$-Fe$_2$O$_3$ nanoparticles (14.0 kA/m) but larger than the Fe—Co (0.3 kA/m). The relative permeabilities of the Fe—Co, $\gamma$-Fe$_2$O$_3$/Fe—Co composite, and $\gamma$-Fe$_2$O$_3$/Fe—Co consolidated particles are ~600, ~300, and ~4, respectively. Additionally, the volumetric fraction of the consolidated nanoparticles is estimated to be 40%, based on the ratio of the sample saturation (0.16 T) and the material saturation (separately measured to be 0.40 T).

Referring to FIG. 11, the double layer curve can be conceptualized as the superposition of the individual loops of the $\gamma$-Fe$_2$O$_3$ nanoparticles and the Fe—Co metal. A kink is observed on the double layer curve, indicated by the arrow in the figure, indicative of a mixed, two-phase magnetic response. In contrast, the nanocomposite exhibits a smooth, kink-free curve. These measurements indicate exchange coupling between the nanoparticle inclusion phase and electroplated matrix phase.

Figure 12A:
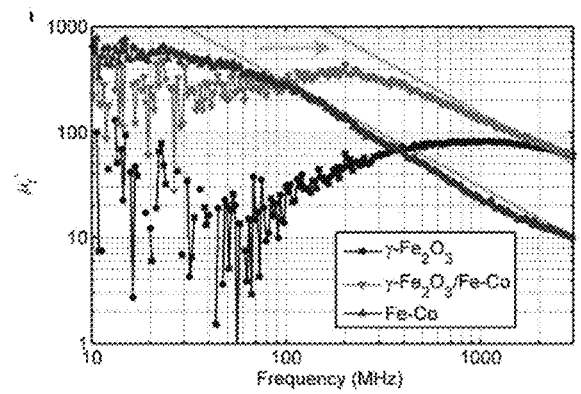
FIGS. 12A and 12B show plots of the complex relative permeability for the $\gamma$-Fe$_2$O$_3$ nanoparticle layer, $\gamma$-Fe$_2$O$_3$/Fe—Co nanocomposite layer and Fe—Co layer, where
Figure 12B:
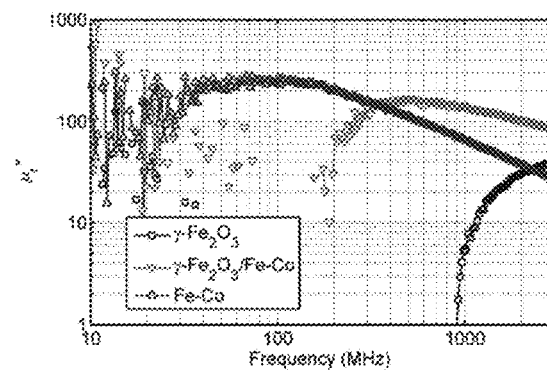

The complex permeabilities, given as $\mu_r(\omega)=\mu_r'(\omega)-j\mu_r''(\omega)$, of the three rectangular samples were characterized at RF frequencies using a microstrip line permeameter test fixture and a vector network analyzer (Agilent E5071C). The reflection coefficient was measured with and without loading the samples, and the permeability was calculated based on perturbation method. FIGS. 12A and 12B show plots of the complex relative permeability for the $\gamma$-Fe$_2$O$_3$ nanoparticle layer, $\gamma$-Fe$_2$O$_3$/Fe—Co nanocomposite layer and Fe—Co layer, where FIG. 12A shows the real part $\mu_r'(\omega)$ and FIG. 12B shows the imaginary part $\mu_r''(\omega)$.

In FIGS. 12A and 12B, the data is scaled such that the low-frequency permeability of the Fe—Co matches the DC permeability extracted from hysteresis loop (600). As illustrated in the Figures, below 100 MHz, the permeability of the nanocomposite is about half the value of Fe—Co alloy, and an order of magnitude higher than the $\gamma$-Fe$_2$O$_3$ particles. The Fe—Co alloy has the lowest resonant frequency at about 100 MHz, while the frequency for the $\gamma$-Fe$_2$O$_3$ nanoparticles is higher than 2 GHz. The nanocomposite exhibits a resonant frequency in between, at about 500 MHz, which can be attributed to exchange coupling between the $\gamma$-Fe$_2$O$_3$ nanoparticles and Fe—Co matrix as well as suppression of eddy currents by the electrically insulating maghemite nanoparticles. The product of the low-frequency permeability and resonant frequency can be used as a figure of merit for performance. This product in the nanocomposite is five times larger than that in the Fe—Co alloy, as indicated by the gray lines in the permeability curves. Additionally, because both phases are magnetic materials, the entire volume is magnetic, thus avoiding the low magnetic fractions associated with polymer-based composites.

Example 2

Synthesis of Magnetic Metal Oxide

This example illustrates synthesis of inclusion phase material in the form of a magnetic metal oxide, particularly Zn substituted ferrites, Ni$_{1-x}$Zn$_x$Fe$_2$O$_4$ and Mn$_{1-x}$Zn$_x$Fe$_2$O$_4$.

In some cases, aqueous co-precipitation processes may be used to synthesize these particles. In other cases, thermal decomposition reactions are used. Polyol and hydro-thermal processes may also be used in some cases. In yet other cases, solvothermal processes may be utilized.

Figure 13A:
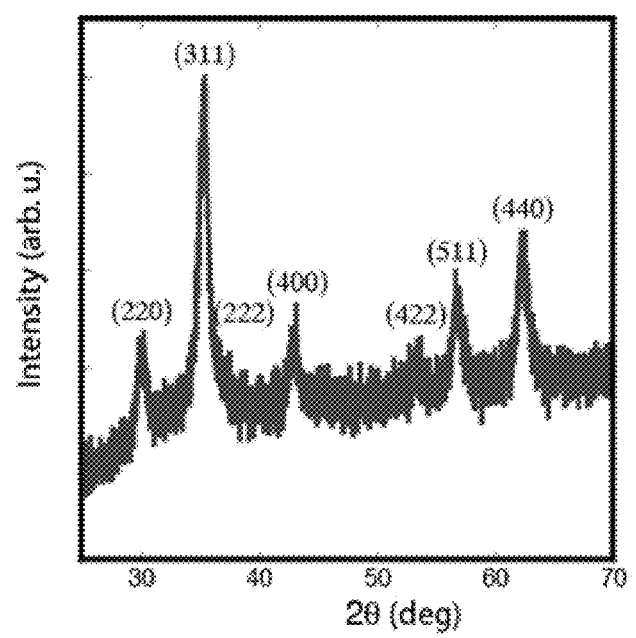
FIGS. 13A-13C show the X-ray diffraction pattern (FIG. 13A), TEM micrograph (FIG. 13B), and particle size distribution (FIG. 13C) for Ni$_{0.5}$Zn$_{0.5}$Fe$_2$O$_4$ particles prepared via aqueous co-precipitation, according to an example implementation.
Figure 13B:
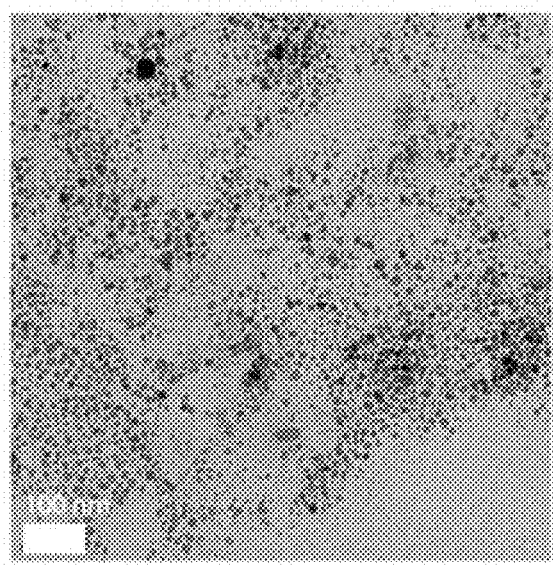
Figure 13C:
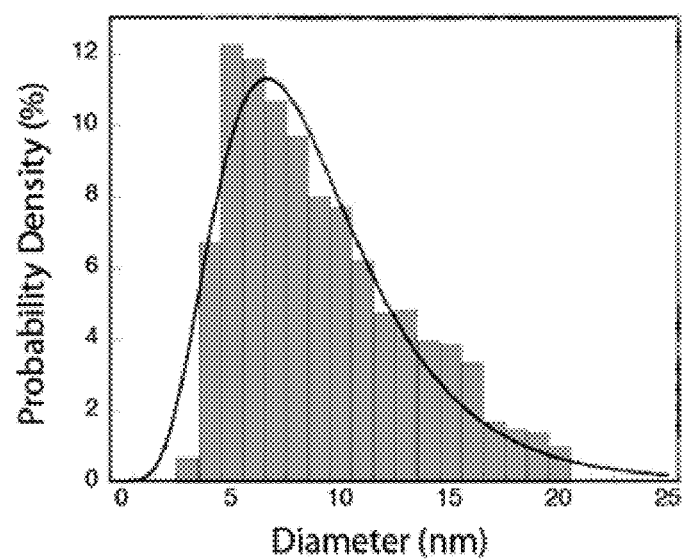

FIGS. 13A-13C show results of Ni$_{0.5}$Zn$_{0.5}$Fe$_2$O$_4$ nanoparticles synthesized using co-precipitation of metal salts in an alkaline environment. As illustrated in FIGS. 13A-13C, the particles are relatively monodisperse with an average diameter of 8-10 nm. One of the many advantages of this method is that it is high yield, making it suitable for commercial applications.

Figure 14:
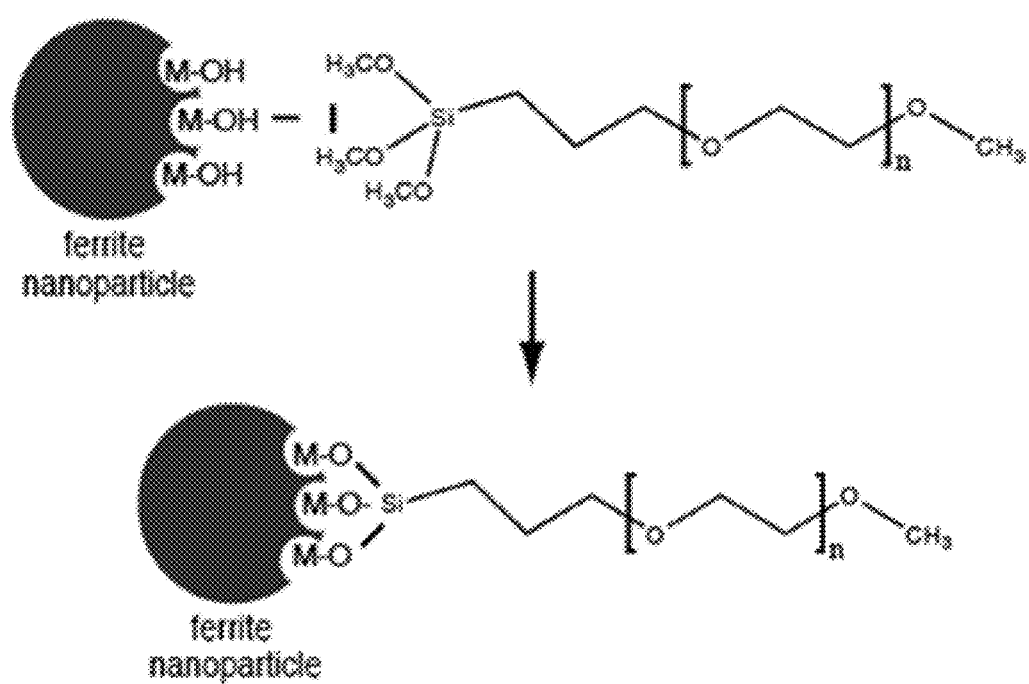
FIG. 14 illustrates surface functionalization for Ni$_{0.5}$Zn$_{0.5}$Fe$_2$O$_4$ particles prepared via aqueous co-precipitation, according to the example implementation.

The surfaces of the ferrite particles can be modified via silane chemistry as shown in FIG. 14. Silanes may be used based on the ability of silica to form strong covalent bonds with ferrite nanoparticles. Here, a polyethylene oxide (PEO) functionalized silane is grafted to the surface of the ferrite nanoparticle generating a hydrophilic surface coating. By varying the lengths of the PEO and hydrocarbon chains, a particle that disperses in either polar or nonpolar solvents can be formed.

As another example (not shown in the drawings), the ferrite nanoparticles can be synthesized by thermally decomposing metal organic precursors. Then, a ligand exchange on the synthesized ferrite nanoparticles can be performed to allow water solubility and functionalization of the ferrite nanoparticles.

Thermal decomposition of metal organic precursors in high temperature solvents (e.g., those with higher boiling points) in the presence of surfactants can be used to control size and shape, for example increasing resultant particle size.

By varying temperature, heating rate and pressure of synthesis reactions, types of precursors, and types of surfactants, size and shape of the nanoparticles are optimally controlled. Methods for the size and shape control of Ni$_{1-x}$Zn$_x$Fe$_2$O$_4$ and Mn$_{1-x}$Zn$_x$Fe$_2$O$_4$ nanoparticles are discussed below.

For example, iron (III) acetylacetonate (Fe(acac)$_3$), nickel (II) acetylacetonate (Ni(acac)$_2$), and zinc (II) acetylacetonate (Zn(acac)$_2$) can be prepared in stoichiometric amounts and mixed in a high temperature solvent, such as octadecane or benzyl ether. Alternatively, iron (III) acetylacetonate (Fe(acac)$_3$), manganese (II) acetylacetonate (Mn(acac)$_2$), and zinc (II) acetylacetonate (Zn(acac)$_2$) are mixed in stoichiometric amounts in a high temperature solvent, such as octadecane or benzyl ether. The metal organic precursors may also be mixed with varying ratios of surfactants such as oleic acid, oleylamine, and tri-n-octylphosphine oxide (TOPO), in order to obtain nanoparticles of spherical, prismadic, or cubic shapes.

The as-synthesized nanoparticles may have a hydrophobic surface coating. Ligand exchange can be performed to stabilize the as-synthesized nanoparticles to allow water solubility as well as subsequent functionalization. Ligand exchange can be performed using solutions such as dimercaptosuccinic acid (DMSA) or thiomalic acid (TMA). These ligands both have thiol and carboxylic acid functionalities, which are effective for oleic acid coated magnetic particles The carboxylic acid and thiol functionality can be used for further functionalization through reactions with the exposed carboxylic acid groups or thiols. According to certain embodiments, the nanoparticles may be synthesized with hydrophilic, hydrophobic, cationic, and anionic ligands. This variety in surface functionality can be exploited when consolidating the nanoparticles into materials to obtain particle consolidations with high particle fill factors.

Example 3

Synthesis of Magnetic Metal Alloy Particles

This example illustrates synthesis of inclusion phase material in the form of a magnetic metal alloy. In this example, high magnetic saturation metal alloys such as iron (Fe) and cobalt (Co) alloys are synthesized and stabilized. $Fe_{100-x}Co_x$ alloy nanoparticles exhibit high magnetic moment and low coercivity, and the highest saturation magnetization of 2.4 T among all ferromagnetic materials.

As an illustrative example, body-centered cubic (bcc) nanoparticles comprising soft magnetic $Fe_{100-x}Co_x$, where x=35 to 40, with sizes in a range from 5 to 50 nm have been synthesized. The magnetic properties of the Fe—Co nanoparticles are optimized by varying compositions and particle sizes of the metal alloy nanoparticles. Moreover, the nanoparticles are functionalized with various surface agents such as polyvinylpyrrolidone to inhibit particle oxidation and agglomeration, while preserving soft magnetic properties to be close to bulk values.

For particles sizes in a range of 25-50 nm, a modified polyol process is used for synthesizing metal alloy nanoparticles. The modified polyol process comprises generating supersaturation, nucleation, and subsequent growing of the nanoparticles. The modified polyol process uses solvent acting as a reducing and oxidation-preventing agent in addition to the molecular or atomic level control and process parameters are varied to control and modify the process. For example, nanoparticle sizes and compositions can be altered by controlling reaction parameters, such as reaction temperature and concentration of metal precursors.

Fe(II) chloride and cobalt acetate tetrahydrate is dissolved in ethylene glycol with appropriate amounts of NaOH. Polyvinylpyrrolidone (PVP) is added as a surfactant to protect the particles from surface oxidation. Under an inert atmosphere, the solution is heated to 120° C. with constant mechanical stirring, and refluxed for a maximum period of one hour. The suspension is then cooled, and the black precipitated particles are separated via centrifuging, followed triple rinsing in ethanol.

For some intended high-frequency applications such as microinductors, the thickness of the oxide coating is controlled in order to control the ferromagnetic resonance properties. Hence, an additional method is performed to prepare amorphous oxide shell coated Fe—Co alloy nanoparticles using a two-step polyol process.

During the first step, the Fe—Co alloy nanoparticles are prepared using the above method. As part of the second step, dielectric coatings are formed by reacting the nanoparticles with corresponding metal oxide precursors at surfaces. For example, tetraethyl orthosilicate, aluminum isopropoxide, and zirconium (iv) acetyl acetonate are used to make amorphous $SiO_2$, $Al_2O_3$, and $ZrO_2$ coatings, respectively.

For smaller Fe—Co particles in a range of 5-20 nm, an alternative approach can be used employing thermal co-decomposition of iron and cobalt acetylacetonate metal precursors in benzyl ether solvents or octyl ether solvents. The stabilization can be achieved by passivating the polymers or ligands during the thermal co-decomposition synthesis reactions. For example, the synthesis is implemented in a reductive decomposition of Fe(III) acetylacetonate $(Fe(acac)_3)$ and Co(II) acetylacetonate $(Co(acac)_2)$ in a mixture of surfactants and 1,2-hexadecanediol under a gas mixture of 93% Ar+7% $H_2$ at 300° C. Sizes of the synthesized nanoparticles are controlled by varying the binding ligands. For example, particles of sizes of about 20 nm are formed when a mixture of oleic acid and oleyl amine is used as surfactants. Conversely, particles of sizes of about 10 nm are obtained by using a combination of oleic acid and trioctylphosphine (TOP) as surfactants. The particles are made air-stable with enhanced magnetic properties by annealing at modest temperatures.

Certain aspects of the invention provide the following non-limiting embodiments:

Example 1. A nanocomposite magnetic material, comprising: a magnetic metal matrix phase; and an inclusion phase of consolidated nanomaterials bound by the magnetic metal matrix phase.

Example 2. The nanocomposite magnetic material of example 1, wherein the magnetic metal matrix phase comprises a soft magnetic material.

Example 3. The nanocomposite magnetic material of example 2, wherein the soft magnetic material comprises Ni, Fe, Co, Ni—Fe alloy, or Co—Fe alloy.

Example 4. The nanocomposite magnetic material of example 1, wherein the magnetic metal matrix phase comprises a hard magnetic material.

Example 5. The nanocomposite magnetic material of example 4, wherein the hard magnetic material comprises alloys of Co—Ni, Co—Pt, Fe—Pt, Nd—Fe—B, or Sm—Co.

Example 6. The nanocomposite magnetic material of example 1, wherein the magnetic metal matrix phase comprises a magnetostrictive material.

Example 7. The nanocomposite magnetic material of any of examples wherein the inclusion phase comprises ceramic particles or polymer nanomaterials.

Example 8. The nanocomposite magnetic material of any of examples wherein the inclusion phase comprises $Ni_{1-x}Zn_xFe_2O_4$ or $Mn_{1-x}Zn_xFe_2O_4$, where $0 \leq x \leq 1$.

Example 9. The nanocomposite magnetic material of any of examples 1-6, wherein the inclusion phase comprises nanomaterials of a metal alloy with a dielectric shell.

Example 10. The nanocomposite magnetic material of any of examples 1-9, wherein the inclusion phase has a fill fraction of 20-40% by volume.

Example 11. The nanocomposite magnetic material of any of examples 1-9, wherein the inclusion phase has a fill fraction of 40-60% by volume.

Example 12. The nanocomposite magnetic material of any of examples 1-9, wherein the inclusion phase has a fill fraction of 60-80% by volume.

Example 13. The nanocomposite magnetic material of any of examples 1-9, wherein the inclusion phase has a fill fraction of 80-95% by volume.

Example 14. The nanocomposite magnetic material of any of examples 1-13, wherein a thickness of the nanocomposite magnetic material is in a range of about 100 nm to about 5 μm.

Example 15. The nanocomposite magnetic material of any of examples 1-13, wherein a thickness of the nanocomposite magnetic material is in a range of about 50 μm to about 500 μm.

Example 16. The nanocomposite magnetic material of any of examples 1-13, wherein a thickness of the nanocomposite magnetic material is in a range of about 100 nm to about 500 μm.

Example 17. A method of forming a nanocomposite magnetic material, comprising: consolidating synthesized nanomaterials of at least one inclusion phase into a porous microstructure; and performing an electro-infiltration process to fill voids of the porous microstructure with a magnetic metal matrix phase.

Example 18. The method of example 17, wherein consolidating synthesized nanomaterials comprises: using at least one magnet or at least one external magnetic field to direct the synthesized particles.

Example 19. The method of example 17, wherein consolidating synthesized nanomaterials comprises: using an applied electric bias to generate an electric field to direct the synthesized particles.

Example 20. The method of any of examples 17-19, further comprising: selecting the synthesized nanomaterials according to at least one of size, shape, surface coating and magnetic properties.

Example 21. The method of example 20, wherein the synthesized nanomaterials comprise at least one shape selected from a group consisting of spherical, nanoflake, nanodisc, nanorod, and nanowire.

Example 22. The method of any of examples 17-21, further comprising: forming a mold on a planar substrate, wherein the synthesized nanomaterials are consolidated in the mold; and removing the mold after performing the electro-infiltration process leaving bound consolidated nanomaterials on the planar substrate.

Example 23. The method of example 22, further comprising: removing the unbound consolidated nanomaterials from the planar substrate.

Example 24. The method of any of examples 17-23, wherein performing the electro-infiltration process comprises: electroplating the porous microstructure with the metal magnetic matrix phase from a bottom surface to a top surface of the porous microstructure.

Example 25. The method of any of examples 17-23, wherein performing the electro-infiltration process comprises: electroless plating the porous microstructure with the metal magnetic matrix phase.

Example 26. A method comprising: performing semiconductor processing to fabricate at least one semiconductor device on a semiconductor wafer; and forming a structure comprising magnetic material on the semiconductor wafer using a nanocomposite magnetic material, the nanocomposite magnetic material formed by consolidating synthesized nanomaterials of at least one inclusion phase into a porous microstructure; and performing an electro-infiltration process to fill voids of the porous microstructure with a magnetic metal matrix phase.

Example 27. The method of example 26, wherein consolidating synthesized nanomaterials comprises: using at least one magnet or at least one external magnetic field to direct the synthesized particles.

Example 28. The method of example 26, wherein consolidating synthesized nanomaterials comprises: using an applied electric bias to generate an electric field to direct the synthesized particles.

Example 29. The method of any of examples 26-28, wherein the nanocomposite magnetic material is further formed by: selecting the synthesized nanomaterials according to at least one of size, shape, surface coating and magnetic properties.

Example 30. The method of example 29, wherein the synthesized nanomaterials comprise at least one shape selected from a group consisting of spherical, nanoflake, nanodisc, nanorod, and nanowire.

Example 31. The method of any of examples 26-30, wherein the nanocomposite magnetic material is further formed by: forming a mold on a planar substrate, wherein the synthesized nanomaterials are consolidated in the mold; and removing the mold after performing the electro-infiltration process leaving bound consolidated nanomaterials on the planar substrate.

Example 32. The method of example 31, wherein the nanocomposite magnetic material is further formed by: removing the unbound consolidated nanomaterials from the planar substrate.

Example 33. The method of any of examples 26-32, wherein performing the electro-infiltration process comprises: electroplating the porous microstructure with the metal magnetic matrix phase from a bottom surface to a top surface of the porous microstructure.

Example 34. The method of any of examples 26-32, wherein performing the electro-infiltration process comprises: electroless plating the porous microstructure with the metal magnetic matrix phase.

Example 35. The method of any of examples 26-34, wherein the nanocomposite magnetic material comprises a plurality of bound consolidated nanomaterials of the at least one inclusion phase and the magnetic metal matrix phase.

Example 36. The method of example 35, wherein the plurality of bound consolidated nanomaterials are of different sizes and/or shapes.

Example 37. The method of any of examples 35-36, wherein the plurality of bound consolidated nanomaterials comprise a heterogeneous mix of bound consolidated nanomaterials in which some of the bound consolidated nanomaterials have different characteristics than other of the bound consolidated nanomaterials.

Example 38. The method of any of examples 35-37, wherein a thickness of at least some of the bound consolidated nanomaterials is in a range of about 100 nm to about 5 μm.

Example 39. The method of any of examples 35-37, wherein a thickness of at least some of the bound consolidated nanomaterials is in a range of about 50 μm to about 500 μm.

Example 40. The method of any of examples 35-37, wherein a thickness of at least some of the bound consolidated nanomaterials is in a range of about 100 nm to about 500 μm.

Example 41. The method of any of examples 26-40, wherein the magnetic metal matrix phase comprises a soft magnetic material.

Example 42. The method of example 41, wherein the soft magnetic material comprises Ni, Fe, Co, Ni—Fe alloy, or Co—Fe alloy.

Example 43. The method of any of examples 26-40, wherein the magnetic metal matrix phase comprises a hard magnetic material.

Example 44. The method of example 43, wherein the hard magnetic material comprises alloys of Co—Ni, Co—Pt, Fe—Pt, Nd—Fe—B, or Sm—Co.

Example 45. The method of any of examples 26-40, wherein the magnetic metal matrix phase comprises a magnetostrictive material.

Example 46. The method of any of examples 26-45, wherein the at least one inclusion phase comprises ceramic particles or polymer nanomaterials.

Example 47. The method of any of examples 26-45, wherein the at east one inclusion phase comprises $Ni_{1-x}Zn_xFe_2O_4$ or $Mn_{1-x}Zn_xFe_2O_4$, where $0 \leq x \leq 1$.

Example 48. The method of any of examples 26-45, wherein the at least one inclusion phase comprises nanomaterials of a metal alloy with a dielectric shell.

Example 49. The method of any of examples 26-48, wherein the at least one inclusion phase has a fill fraction of 20-40% by volume.

Example 50. The method of any of examples 26-48, wherein the at least one inclusion phase has a fill fraction of 40-60% by volume.

Example 51. The method of any of examples 26-48, wherein the at east one inclusion phase has a fill fraction of 60-80% by volume.

Example 52. The method of any of examples 26-48, wherein the at least one inclusion phase has a fill fraction of 80-95% by volume.

Example 53. The method of any of examples 35-48, wherein the plurality of bound consolidated nanomaterials comprises: a first plurality of bound consolidated nanomaterials of a first inclusion phase and a first magnetic metal matrix phase; and a second plurality of bound consolidated nanomaterials of a second inclusion phase and a second magnetic metal matrix phase, wherein at least one of the first inclusion phase and the first magnetic metal phase of the first plurality of bound consolidated nanomaterials is different than the second inclusion phase and the second magnetic metal phase of the second plurality of bound consolidated nanomaterials.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

All patents, patent applications, provisional applications, and publications referred to or cited herein are incorporated by reference in their entirety, including all figures and tables, to the extent they are not inconsistent with the explicit teachings of this specification.

What is claimed is:

1. A method of forming a nanocomposite magnetic material, comprising:
prior to an electro-infiltration process, consolidating synthesized nanomaterials of at least one inclusion phase into a porous microstructure, wherein consolidating synthesized nanomaterials comprises using at least one magnet or at least one external magnetic field to direct particles of the synthesized nanomaterials on a substrate within a first liquid solution and evaporating the first liquid solution to leave the consolidated synthesized nanomaterial as the porous microstructure on the substrate; and
after forming the porous microstructure, performing the electro-infiltration process within a second liquid solution to fill voids of the porous microstructure with a magnetic metal matrix phase.

2. The method of claim 1, wherein performing the electro-infiltration process comprises electroplating the magnetic metal matrix phase within the voids of the porous microstructure.

3. The method of claim 1, further comprising:
selecting the synthesized nanomaterials according to at least one of size, shape, surface coating and magnetic properties;
forming a mold on a planar substrate, wherein the synthesized nanomaterials are consolidated in the mold, wherein the substrate comprises the planar substrate;
removing the mold after performing the electro-infiltration process leaving bound consolidated nanomaterials on the planar substrate; and
removing unbound consolidated nanomaterials from the planar substrate,
wherein the synthesized nanomaterials comprise at least one shape selected from a group consisting of spherical, nanoflake, nanodisc, nanorod, and nanowire.

4. The method of claim 1, wherein performing the electro-infiltration process comprises electroplating the metal magnetic matrix phase within the voids of the porous microstructure from a bottom surface to a top surface of the porous microstructure.

5. The method of claim 1, wherein performing the electro-infiltration process comprises electroless plating of the magnetic metal matrix phase within the voids of the porous microstructure.

6. A method comprising:
performing semiconductor processing to fabricate at least one semiconductor device on a semiconductor wafer;
prior to an electro-infiltration process, forming a structure comprising magnetic material on the semiconductor wafer using a nanocomposite magnetic material, the nanocomposite magnetic material formed by consolidating synthesized nanomaterials of at least one inclusion phase into a porous microstructure on the semiconductor wafer within a first liquid solution and evaporating the first liquid solution to leave the consolidated synthesized nanomaterial as the porous microstructure on the semiconductor wafer; and
after forming the porous microstructure, performing the electro-infiltration process within a second liquid solution to fill voids of the porous microstructure with a magnetic metal matrix phase,
wherein the nanocomposite magnetic material comprises a plurality of bound consolidated nanomaterials of the at least one inclusion phase and the magnetic metal matrix phase.

7. The method of claim 6, wherein performing the electro-infiltration process comprises electroplating the magnetic metal matrix phase within the voids of the porous microstructure.

8. The method of claim 6, wherein performing the electro-infiltration process comprises electroplating the metal magnetic matrix phase within the voids of the porous microstructure from a bottom surface to a top surface of the porous microstructure.

9. The method of claim 6, wherein performing the electro-infiltration process comprises electroless plating of the magnetic metal matrix phase within the voids of the porous microstructure.

10. The method of claim 6, wherein the plurality of bound consolidated nanomaterials are a heterogeneous mixture of different sizes, different shapes, or both.

11. The method of claim 6, wherein the plurality of bound consolidated nanomaterials have a same size and/or shape.

12. The method of claim 6, wherein the plurality of bound consolidated nanomaterials comprises:
- a first plurality of bound consolidated nanomaterials of a first inclusion phase and a first magnetic metal matrix phase; and
- a second plurality of bound consolidated nanomaterials of a second inclusion phase and a second magnetic metal matrix phase,
- wherein at least one of the first inclusion phase and the first magnetic metal matrix phase of the first plurality of bound consolidated nanomaterials is different than the second inclusion phase and the second magnetic matrix metal phase of the second plurality of bound consolidated nanomaterials.

13. The method of claim 1, wherein the at least one inclusion phase comprises nanomaterials of a metal alloy with a dielectric shell.

14. The method of claim 13, wherein the dielectric shell comprises an $Al_2O_3$ coating, a $ZrO_2$ coating, a $SiO_2$ coating, or a polymer coating.

15. The method of claim 6, wherein the at least one inclusion phase comprises nanomaterials of a metal alloy with a dielectric shell.

16. The method of claim 15, wherein the dielectric shell comprises an $Al_2O_3$ coating, a $ZrO_2$ coating, a $SiO_2$ coating, or a polymer coating.

17. The method of claim 6, wherein consolidating synthesized nanomaterials comprises using at least one magnet or at least one external magnetic field to direct particles of the synthesized nanomaterials, wherein the consolidated synthesized nanomaterials is formed of a hard magnetic material and the magnetic metal matrix phase is formed of a soft magnetic material.

18. A method of forming a nanocomposite magnetic material, comprising:
- prior to an electro-infiltration process, consolidating synthesized nanomaterials of at least one inclusion phase into a porous microstructure within a first liquid solution using an external magnetic field, wherein the first liquid solution is evaporated to leave the consolidated synthesized nanomaterial as the porous microstructure;
- after forming the porous microstructure, performing the electro-infiltration process to fill voids of the porous microstructure with a magnetic metal matrix phase within a second liquid solution; and
- applying an a magnetic back-electrode during the electro-infiltration process to ensure that the consolidated synthesized nanomaterials remain in place.

19. The method of claim 18, wherein performing the electro-infiltration process comprises electroplating the magnetic metal matrix phase within the voids of the porous microstructure.

20. The method of claim 18, wherein performing the electro-infiltration process comprises electroless plating of the magnetic metal matrix phase within the voids of the porous microstructure.

21. The method of claim 1, wherein the external magnetic field is used to direct the particles of the synthesized nanomaterials prior to the electro-infiltration process, wherein the synthesized nanomaterials is formed of a hard magnetic material and the magnetic metal matrix phase is formed of a soft magnetic material.

* * * * *